(12) United States Patent
Williams et al.

(10) Patent No.: US 7,557,452 B1
(45) Date of Patent: Jul. 7, 2009

(54) REINFORCED, SELF-ALIGNING CONDUCTIVE STRUCTURES FOR SEMICONDUCTOR DEVICE COMPONENTS AND METHODS FOR FABRICATING SAME

(75) Inventors: Vernon M. Williams, Meridian, ID (US); Ford B. Grigg, Meridian, ID (US); Bret K. Street, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 1592 days.

(21) Appl. No.: 09/590,646

(22) Filed: Jun. 8, 2000

(51) Int. Cl.
*H01L 23/48* (2006.01)
*H01L 21/00* (2006.01)

(52) U.S. Cl. .................. 257/778; 257/697; 257/737; 257/777; 257/779; 257/780; 257/781; 438/108

(58) Field of Classification Search .................. None
See application file for complete search history.

(56) References Cited

U.S. PATENT DOCUMENTS

| 5,173,220 A | 12/1992 | Reiff et al. |
| 5,264,061 A | 11/1993 | Juskey et al. |
| 5,278,442 A | 1/1994 | Prinz et al. |

(Continued)

FOREIGN PATENT DOCUMENTS

| JP | 401136357 | * | 5/1989 |
| JP | 405047984 | * | 2/1993 |

OTHER PUBLICATIONS

Miller et al., "Maskless Mesoscale Materials Deposition", Deposition Technology, Sep. 2001, pp. 20-22.

Miller, "New Laser-Directed Deposition Technology", Microelectronic Fabrication, Aug. 2001, p. 16.

(Continued)

*Primary Examiner*—Matthew Smith
*Assistant Examiner*—James M Mitchell
(74) *Attorney, Agent, or Firm*—TraskBritt PC

(57) ABSTRACT

A conductive structure configured to connect a contact pad of a semiconductor device with a corresponding contact pad of a substrate. The conductive structure includes two interconnectable members, one securable to each of the corresponding contact pads. Each member includes a dielectric jacket having an aperture that laterally confines conductive material of a conductive center thereof over the contact pad to which the member is secured. The conductive center of a female member of the conductive structure only partially fills the aperture of the jacket thereof so as to form a receptacle for an end of the male member of the conductive structure. One or both of the male and female members may also be configured to limit the insertion of the male member into the receptacle of the female member. The members of the conductive structure may be preformed structures which are attached to a surface of a semiconductor device or other substrate. Alternatively, the members can be fabricated on the surface of the semiconductor device or other substrate. A stereolithographic method of fabricating at least the jackets of the members is disclosed. The stereolithographic method may include use of a machine vision system including at least one camera operably associated with a computer controlling a stereolithographic application of material so that the system may recognize the position and orientation of a semiconductor device or other substrate on which a member of the conductive structure is to be fabricated. Methods of connecting a semiconductor device with another substrate are also disclosed, as are assemblies including the conductive structures.

129 Claims, 7 Drawing Sheets

U.S. PATENT DOCUMENTS

| | | | | |
|---|---|---|---|---|
| 5,329,423 | A | * | 7/1994 | Scholz ........................ 361/760 |
| 5,411,400 | A | * | 5/1995 | Subrahmanyan et al. ...... 439/68 |
| 5,418,471 | A | * | 5/1995 | Kardos ........................ 324/758 |
| 5,484,314 | A | | 1/1996 | Farnworth |
| 5,545,367 | A | | 8/1996 | Bae et al. |
| 5,646,442 | A | * | 7/1997 | Abe et al. .................... 257/697 |
| 5,705,117 | A | | 1/1998 | O'Connor et al. |
| 5,767,580 | A | * | 6/1998 | Rostoker ..................... 257/737 |
| 5,932,891 | A | * | 8/1999 | Higashi et al. ................. 257/48 |
| 5,940,679 | A | * | 8/1999 | Tomura et al. ................ 438/15 |
| 5,959,845 | A | * | 9/1999 | Faucher ....................... 361/777 |
| 6,007,349 | A | * | 12/1999 | Distefano et al. ............. 439/71 |
| 6,251,488 | B1 | | 6/2001 | Miller et al. |
| 6,259,962 | B1 | | 7/2001 | Gothait |
| 6,268,584 | B1 | | 7/2001 | Keicher et al. |
| 6,391,251 | B1 | | 5/2002 | Keicher et al. |
| 6,506,671 | B1 | | 1/2003 | Grigg |
| 6,524,346 | B1 | | 2/2003 | Farnworth |
| 6,525,408 | B2 | | 2/2003 | Akram et al. |
| 6,548,897 | B2 | | 4/2003 | Grigg |
| 6,569,753 | B1 | | 5/2003 | Akram et al. |
| 6,669,489 | B1 | * | 12/2003 | Dozier et al. .................. 439/71 |
| 2002/0046856 | A1 | * | 4/2002 | Alcoe ........................ 174/52.1 |
| 2002/0105074 | A1 | | 8/2002 | Akram et al. |
| 2002/0171177 | A1 | | 11/2002 | Kritchman et al. |
| 2003/0043360 | A1 | | 3/2003 | Farnworth |
| 2003/0098499 | A1 | | 5/2003 | Akram et al. |
| 2003/0102566 | A1 | | 6/2003 | Farnworth |
| 2003/0139030 | A1 | | 7/2003 | Grigg |
| 2003/0151167 | A1 | | 8/2003 | Kritchman et al. |
| 2003/0173665 | A1 | | 9/2003 | Grigg |
| 2003/0176016 | A1 | | 9/2003 | Grigg |
| 2003/0203612 | A1 | | 10/2003 | Akram et al. |
| 2003/0207213 | A1 | | 11/2003 | Farnworth |

OTHER PUBLICATIONS

Webpage, Objet Prototyping the Future, "Objet FullCure700 Series", 1 page.

Webpage, Objet Prototyping the Future, "How it Works", 2 pages.

U.S. Appl. No. 10/672,098, filed Sep. 26, 2003, entitled "Apparatus and Methods for Use in Stereolithographic Processing of Components and Assemblies", inventor Warren M. Farnworth.

* cited by examiner

REINFORCED, SELF-ALIGNING CONDUCTIVE STRUCTURES FOR SEMICONDUCTOR DEVICE COMPONENTS AND METHODS FOR FABRICATING SAME

BACKGROUND OF THE INVENTION

1. Field of the Invention

The present invention relates generally to conductive structures for use with semiconductor device components, such as flip-chip type semiconductor devices, including chip scale packages. Particularly, the present invention pertains to complementarily configured and located conductive structures on a semiconductor device and another substrate to which the semiconductor device is to be connected. The invention also relates to methods of fabricating the conductive structures and, more particularly, to the use of stereolithography to fabricate at least a portion of the conductive structures.

2. State of the Art

Conductive Structures Used to Connect a Semiconductor Device Face-Down to a Higher Level Substrate Some types of semiconductor devices, such as flip-chip type semiconductor devices, including flip-chip type dice and ball grid array (BGA) packages (including chip scale packages, or CSPs), can be connected to higher level substrates by orienting these semiconductor devices face-down over the higher level substrate. The contact pads of such semiconductor devices are typically connected directly to corresponding contact pads of the higher level substrate by solder balls.

Examples of solders that are known in the art to be useful in connecting semiconductor devices face-down to higher level substrates include, but are not limited to, lead-tin (Pb/Sn) solder, silver-nickel (Ag/Ni) solder, copper, gold, and conductive- or conductor-filled polymers. For example, 95/5 type Pb/Sn solder bumps (i.e., solder having about 95% by weight lead and about 5% by weight tin) have been used in flip-chip and ball grid array type attachments, including chip scale packages (CSPs).

When 95/5 type Pb/Sn solder bumps are employed as conductive structures to form a direct connection between a contact pad of a semiconductor device and a contact pad of a higher level substrate, a quantity of solder paste having a higher melting temperature, such as 63/37 type Pb/Sn solder, can be applied to the contact pad of the higher level substrate to facilitate bonding of the solder bump thereto. As the 95/5 type Pb/Sn solder and the 63/37 type Pb/Sn solder are heated to bond the solder bump to a contact pad of the substrate, the 95/5 type Pb/Sn solder, which has a lower melting temperature, softens first. Thus, the gravitational or compressive forces holding the semiconductor device in position over the higher level substrate can cause the softened 95/5 type Pb/Sn solder bump to flatten, pushing the solder laterally outward onto portions of the surface of the semiconductor device that surround the contact pad to which the solder bump is secured.

Further, when solder balls are reflowed to connect a semiconductor device to a substrate, a phenomenon referred to as "outgassing" occurs, which can damage a semiconductor device proximate to the solder balls. Moreover, relatively high temperatures are required to reflow even low temperature solders, such as 95/5 type Pb/Sn solders. The reflow temperatures can damage package components, such as packaging or encapsulant materials, and even features of the semiconductor die being connected to the substrate.

Assemblies that include semiconductor devices connected face-down to higher level substrates are subjected to thermal cycling during further processing, testing thereof and in normal use. As these assemblies undergo thermal cycling, the solder balls thereof are also exposed to wide ranges of temperatures, causing the solder balls to expand when heated and contract when cooled. Solder balls have a very different coefficient of thermal expansion that the primary materials of the semiconductor device and the substrate between which the solder balls are disposed. Thus, the amount that the solder balls expand and contract differs significantly from the amount of expansion and contraction of the semiconductor device and the substrate. As a result, repeated variations in temperatures can cause solder fatigue, which can reduce the strength of the solder balls, cause the solder balls to fail, and diminish the reliability of the solder balls. Thermal cycling can also alter the conformations of the conductive structures.

The likelihood that a solder ball will be damaged by thermal cycling is particularly high when the solder ball spreads over and contacts the surface of the semiconductor device or the higher level substrate surrounding the contact pad. The solder ball loses some of its ability to dissipate heat and therefore can be exposed to the full range of temperatures that can occur during thermal cycling. Thus, flattened solder balls and solder balls that contact regions of the surface of a semiconductor device that surround the contact pads thereof are particularly susceptible to the types of damage that can be caused by thermal cycling of the semiconductor device.

Furthermore, when solder balls contact regions of the semiconductor device that surround the contact pads to which the solder balls are secured, undesirable parasitic capacitance can occur.

In an attempt to increase the reliability with which solder balls connect semiconductor devices face-down to higher level substrates, resins have been applied to semiconductor devices to form collars around the bases of the solder balls protruding from the semiconductor devices. These resinous supports laterally contact the bases of the solder balls to enhance the reliability thereof. The resinous supports are applied to a semiconductor device after solder balls have been secured to the contact pads of the semiconductor device and before the semiconductor device is connected face-down to a higher level substrate. As those of skill in the art are aware, however, the shapes of solder balls can change when bonded to the contact-pads of a substrate. If the shapes of the solder balls change, the solder balls can fail to maintain contact with the resinous supports, which could thereby fail to protect or enhance the reliability of the solder balls.

The use of solder balls in connecting a semiconductor device face-down to higher level substrates is also somewhat undesirable from the standpoint that, due to their generally spherical shapes, solder balls consume a great deal of area, or "real estate," on a semiconductor device. Thus, solder balls can unduly limit the minimum spacing between the adjacent contact pads of a semiconductor device and, thus, the minimum pitch of the contact pads on the semiconductor device.

Other types of conductive structures have been used to connect semiconductor devices, including those with relatively tight contact pad pitches, to substrates. Examples of these alternative conductive structures include pillars of conductive elastomer or conductor-filled epoxy. When such conductive pillars are secured to the contact pads of a semiconductor device, however, the conductive materials from which these conductive structures are fabricated can bleed, which may cause the material to flow onto regions of the semiconductor device surrounding the contact pad, which may cause parasitic capacitance, or even electrical shorts when adjacent conductive structures bleed into contact with each other or a conductive structure bleeds onto an adjacent contact pad.

The use of other conductive structures, which have more desirable shapes, such as pillars, or columns, and mushroom-type shapes, and consume less conductive material than solder balls, to connect semiconductor devices face-down to higher level substrates has been limited since these taller and thinner conductive structures are typically made from materials that do not retain their shapes upon being bonded to the contact pads of a higher level substrate or in thermal cycling of the semiconductor device.

The inventors are not aware of any art that discloses reinforced, self-aligning conductive structures that facilitate the connection of a semiconductor device to a substrate while preventing conductive material from bleeding or flowing over the edges of contact pads to which the conductive structures are secured. Moreover, the inventors are not aware of methods that can be used to fabricate such reinforced conductive structures.

Stereolithography

In the past decade, a manufacturing technique termed "stereolithography," also known as "layered manufacturing," has evolved to a degree where it is employed in many industries.

Essentially, stereolithography as conventionally practiced involves utilizing a computer to generate a three-dimensional (3-D) mathematical simulation or model of an object to be fabricated, such generation usually effected with 3-D computer-aided design (CAD) software. The model or simulation is mathematically separated or "sliced" into a large number of relatively thin, parallel, usually vertically superimposed layers, each layer having defined boundaries and other features associated with the model (and thus the actual object to be fabricated) at the level of that layer within the exterior boundaries of the object. A complete assembly or stack of all of the layers defines the entire object, and surface resolution of the object is, in part, dependent upon the thickness of the layers.

The mathematical simulation or model is then employed to generate an actual object by building the object, layer by superimposed layer. A wide variety of approaches to stereolithography by different companies has resulted in techniques for fabrication of objects from both metallic and nonmetallic materials. Regardless of the material employed to fabricate an object, stereolithographic techniques usually involve disposition of a layer of unconsolidated or unfixed material corresponding to each layer within the object boundaries, followed by selective consolidation or fixation of the material to at least a partially consolidated, or semi-solid, state in those areas of a given layer corresponding to portions of the object, the consolidated or fixed material also at that time being substantially concurrently bonded to a lower layer of the object to be fabricated. The unconsolidated material employed to build an object may be supplied in particulate or liquid form, and the material itself may be consolidated or fixed, or a separate binder material may be employed to bond material particles to one another and to those of a previously-formed layer. In some instances, thin sheets of material may be superimposed to build an object, each sheet being fixed to a next lower sheet and unwanted portions of each sheet removed, a stack of such sheets defining the completed object. When particulate materials are employed, resolution of object surfaces is highly dependent upon particle size, whereas when a liquid is employed, surface resolution is highly dependent upon the minimum surface area of the liquid which can be fixed and the minimum thickness of a layer that can be generated. Of course, in either case, resolution and accuracy of object reproduction from the CAD file is also dependent upon the ability of the apparatus used to fix the material to precisely track the mathematical instructions indicating solid areas and boundaries for each layer of material. Toward that end, and depending upon the layer being fixed, various fixation approaches have been employed, including particle bombardment (electron beams), disposing a binder or other fixative (such as by ink-jet printing techniques), or irradiation using heat or specific wavelength ranges.

An early application of stereolithography was to enable rapid fabrication of molds and prototypes of objects from CAD files. Thus, either male or female forms on which mold material might be disposed might be rapidly generated. Prototypes of objects might be built to verify the accuracy of the CAD file defining the object and to detect any design deficiencies and possible fabrication problems before a design was committed to large-scale production.

In more recent years, stereolithography has been employed to develop and refine object designs in relatively inexpensive materials, and has also been used to fabricate small quantities of objects where the cost of conventional fabrication techniques is prohibitive for same, such as in the case of plastic objects conventionally formed by injection molding. It is also known to employ stereolithography in the custom fabrication of products generally built in small quantities or where a product design is rendered only once. Finally, it has been appreciated in some industries that stereolithography provides a capability to fabricate products, such as those including closed interior chambers or convoluted passageways, which cannot be fabricated satisfactorily using conventional manufacturing techniques. It has also been recognized in some industries that a stereolithographic object or component may be formed or built around another, pre-existing object or component to create a larger product.

However, to the inventor's knowledge, stereolithography has yet to be applied to mass production of articles in volumes of thousands or millions, or employed to produce, augment or enhance products including other, pre-existing components in large quantities, where minute component sizes are involved, and where extremely high resolution and a high degree of reproducibility of results is required. In particular, the inventor is not aware of the use of stereolithography in the fabrication of conductive structures protruding from the contact pads of semiconductor devices, such as flip-chip type semiconductor devices or chip scale packages. Furthermore, conventional stereolithography apparatus and methods fail to address the difficulties of precisely locating and orienting a number of pre-existing components for stereolithographic application of material thereto without the use of mechanical alignment techniques or to otherwise assuring precise, repeatable placement of components.

SUMMARY OF THE INVENTION

The present invention includes a reinforced, self-aligning conductive structure. The conductive structure includes interconnectable male and female members, each having a conductive center and a dielectric jacket formed form a thermally stable resin surrounding the conductive center.

In one embodiment, the female member of the reinforced, self-aligning conductive structure is secured to or fabricated on a contact pad of one of a semiconductor device and a substrate, while the male member is secured to or fabricated on a corresponding contact pad of the other one of the substrate and the semiconductor device. Each of the male and female members include an outer dielectric support component that contains a quantity of conductive material in contact with the contact pad over which each of the members is disposed. The female member has a recess configured complementarily to at least an end of the male member so as to receive the end of the male member. Upon connection of the female and male members, the conductive center portions of the members contact each other to place the corresponding contact pads of the semiconductor device and the substrate in electrical communication with each other.

According to another aspect, the invention includes a method for joining the conductive centers of an assembled male member and female member. The conductive material of each of the male and female members is preferably a thermally curable polymer. Preferably, the material of at least one of the conductive centers is at least partially uncured. Once the male and female members have been assembled, the material of the conductive centers can be fully cured to form an integral conductive center between a contact pad of the semiconductor device and a corresponding contact pad of the substrate. In addition, curing the conductive material of the male and female members following assembly thereof secures the semiconductor device to the substrate.

Alternatively, other conductive materials, such as solders, metals, or metal alloys, can be employed as the conductive centers of each of the male and female members. The conductive centers of an interconnected male member and female member can be formed into an integral conductive center by reflowing the material of the conductive centers.

A conductive structure incorporating teachings of the present invention surrounds the periphery of a contact pad exposed at the surface of a semiconductor device or substrate to confine the conductive material over the contact pad and to prevent the conductive material from bleeding or flowing onto portions of the surface of the semiconductor device or substrate that surround the contact pad.

According to another aspect, the present invention includes a method for fabricating the reinforced conductive structure according to the present invention. In a preferred embodiment of the method, a computer-controlled, 3-D CAD initiated process known as "stereolithography" or "layered manufacturing" is used to fabricate the jacket of both the male and female members. When stereolithographic processes are employed, each jacket is formed as either a single layer or a series of superimposed, contiguous, mutually adhered layers of material.

The stereolithographic method of fabricating the jackets of the present invention preferably includes the use of a machine vision system to locate the semiconductor devices or substrates on which the jackets are to be fabricated, as well as the features or other components on or associated with the semiconductor devices or substrates (e.g., contact pads, conductive traces, etc.). The use of a machine vision system directs the alignment of a stereolithography system with each semiconductor device or substrate for material disposition purposes. Accordingly, the semiconductor devices or substrates need not be precisely mechanically aligned with any component of the stereolithography system to practice the stereolithographic embodiment of the method of the present invention.

In a preferred embodiment, the jackets to be fabricated upon or positioned upon and secured to a semiconductor device component in accordance with the invention are fabricated using precisely focused electromagnetic radiation in the form of an ultraviolet (UV) wavelength laser under control of a computer and responsive to input from a machine vision system, such as a pattern recognition system, to fix or cure selected regions of a layer of a liquid photopolymer material disposed on the semiconductor device or substrate.

The jackets may be fabricated either separately from the semiconductor device or substrate to which they are to be secured or directly on the semiconductor device or substrate. If the jackets are fabricated directly on the semiconductor device or substrate, they may be fabricated around preformed quantities of conductive material protruding from the contact pads of the semiconductor device or substrate. Alternatively, the jackets may be fabricated around or over the peripheries of contact pads of the semiconductor device or substrate with the contact pads being exposed therethrough. Conductive material may then be disposed in the jackets and against the contact pads exposed therethrough.

Following the fabrication of a hollow jacket, a quantity of unconsolidated (e.g., particulate, molten, or uncured liquid) conductive- or conductor-filled material is disposed in the centers of the jackets. Alternatively, stereolithography may also be used to form the conductive centers of the male and female members from an electrically conductive photopolymer. If stereolithography is used to fabricate the conductive centers, the conductive center of at least one of a corresponding pair of members is preferably left at least partially unconsolidated so as to facilitate the subsequent formation of an integral conductive center through the conductive structure.

Other features and advantages of the present invention will become apparent to those of skill in the art through consideration of the ensuing description, the accompanying drawings, and the appended claims.

DETAILED DESCRIPTION OF THE INVENTION

Conductive Structures

Figure 1:
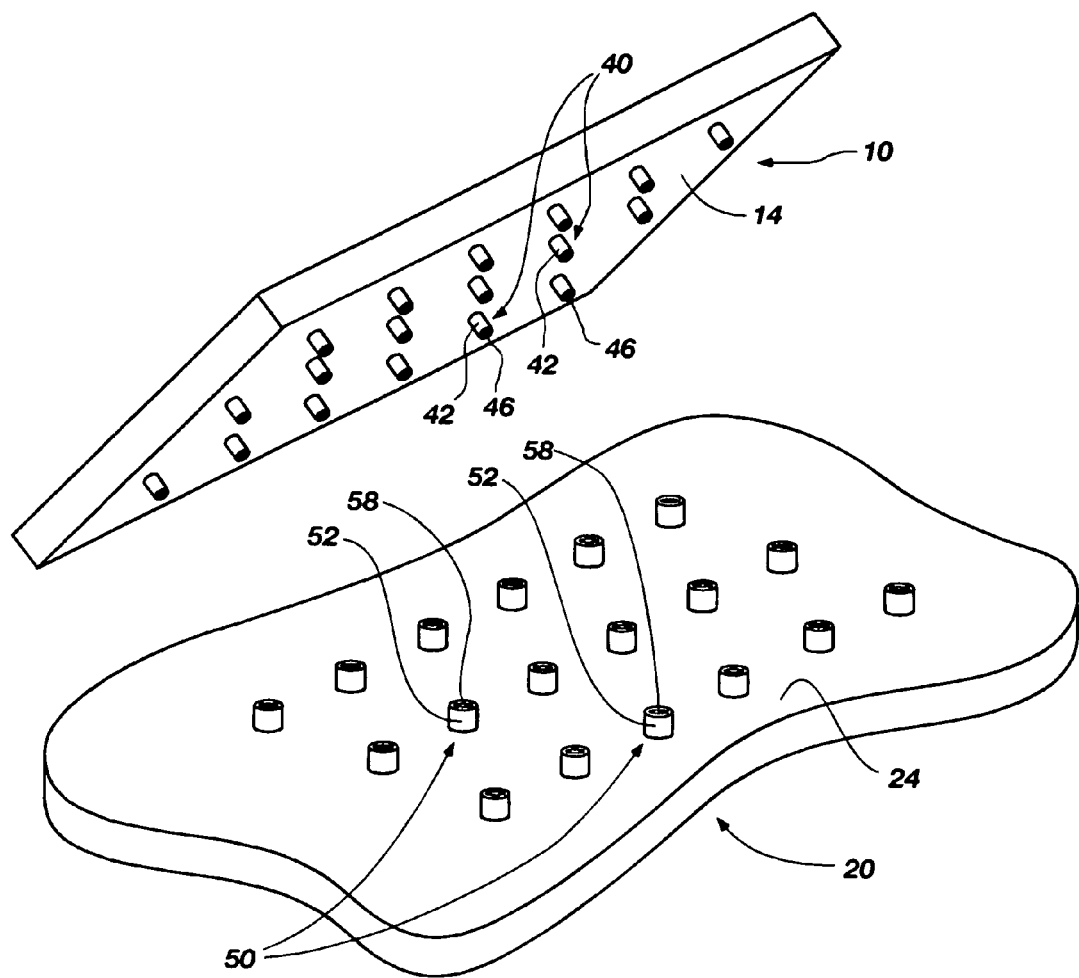
FIG. 1 is a perspective view of a semiconductor device having male members of conductive structures protruding from the contact pads thereof and a carrier substrate having corresponding female members of the conductive structures protruding from the contact pads thereof.

With reference to FIGS. 1 and 4-6, a semiconductor device assembly, including a semiconductor device 10 and a substrate 20, is shown. Semiconductor device 10 is a flip-chip type device, such as a flip-chip die or a ball grid array package, or a flip-chip type chip scale package having contact pads 12 (FIG. 6) on a surface 14 thereof that can each be bonded to corresponding contact pads 22 (FIG. 6) of a surface 24 of substrate 20 by way of conductive structures 30.

Each conductive structure 30 has a separate, interconnectable male member 40 and female member 50. As illustrated, male members 40 are secured to and protrude from contact pads 12 of semiconductor device 10, while female members 50 are secured to and protrude from contact pads 22 of substrate 22.

Figure 2:
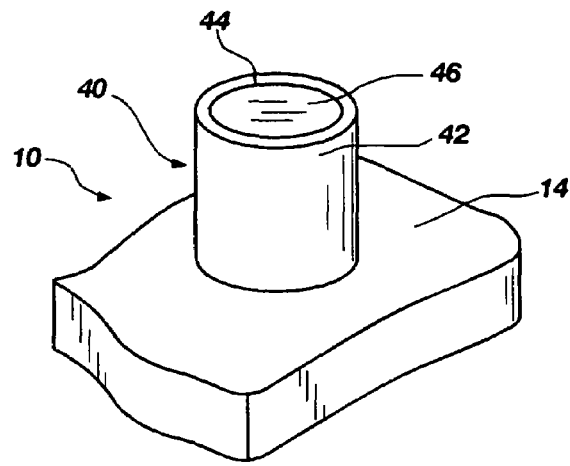
FIG. 2 is an enlarged partial perspective view of a male member on the semiconductor device of FIG. 1.
Figure 6:
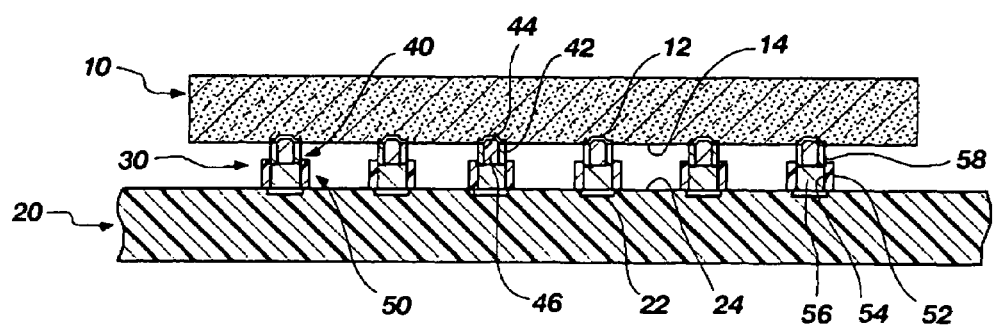
FIG. 6 is a cross-sectional view depicting the semiconductor device and the carrier substrate of FIG. 1 in an assembled relationship with the male members and the female members interconnected.
Figure 4:
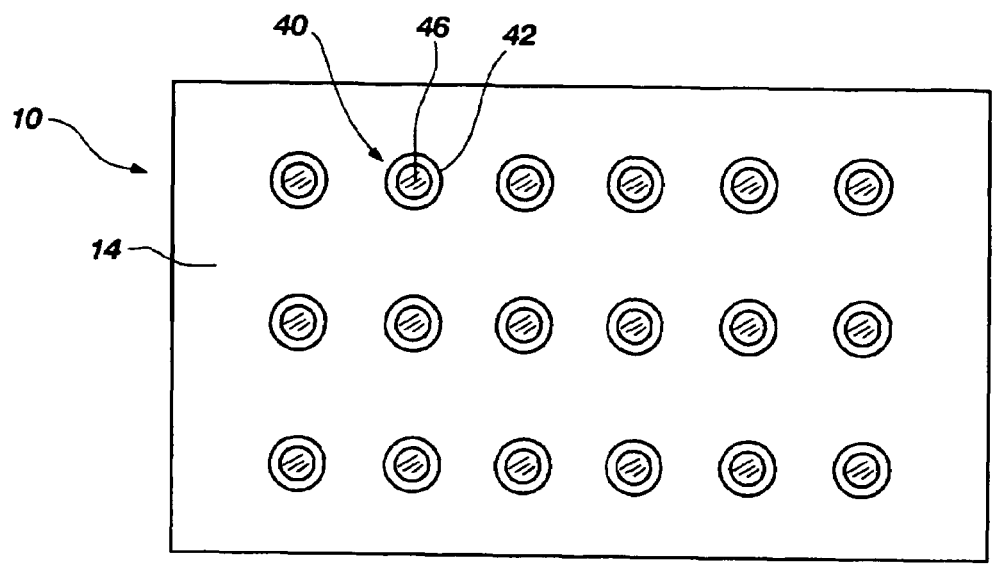
FIG. 4 is a bottom plan view of the semiconductor device of FIG. 1.

Referring now to FIGS. 2 and 6, male members 40 each include a dielectric jacket 42 with an aperture 44 extending through the length thereof. Aperture 44 is filled with a quantity of conductive material referred to herein as a conductive center 46 of male member 40. Preferably, aperture 44 is completely filled with conductive material. Jacket 42 and aperture 44 are configured to contain the material of conductive center 46 over a contact pad 12 and to, therefore, prevent the material of conductive center 46 from bleeding or flowing off of contact pads 12 and onto the surrounding areas of surface 14. Jacket 42 also electrically insulates the lateral periphery of conductive center 46.

Figure 3:
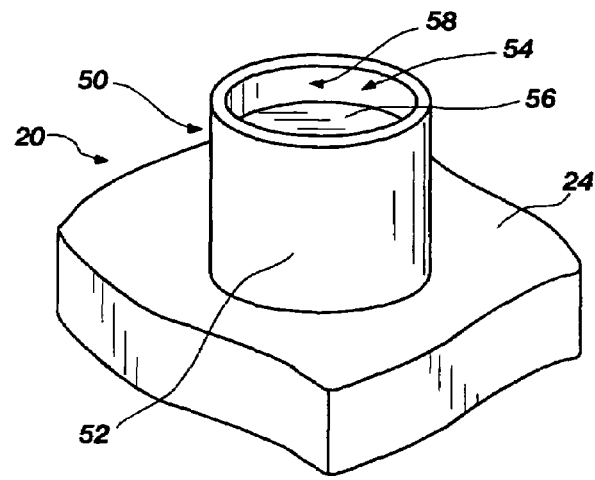
FIG. 3 is an enlarged partial perspective view of a female member on the carrier substrate of FIG. 1.

FIGS. 3 and 6 illustrate female members 50, each of which has a dielectric jacket 52 with an aperture 54 extending through the length thereof. As with male member 40, jacket 52 and aperture 54 are configured to contain the conductive material of conductive center 56 over a contact pad 22 of substrate 20 and to prevent the material of conductive center 56 from bleeding or flowing off of contact pads 22 and onto surrounding areas of surface 24. Jacket 52 also electrically insulates the lateral surfaces of conductive center 56. Unlike aperture 44 of male member 40, aperture 54 is preferably only partially filled with conductive material to form a conductive center 56 of female member 50. An upper portion 58 of aperture 54, which is preferably not filled with conductive material, is configured to matingly receive at least and end portion of male member 40. Upper portion 58 is also referred to herein as a receptacle.

Figure 7:
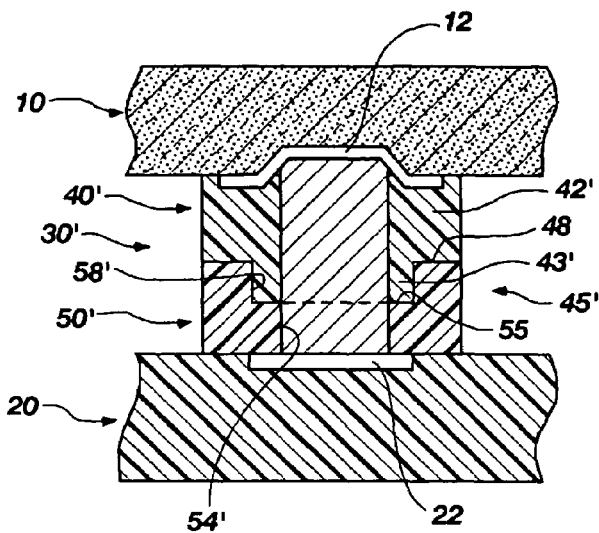
FIG. 7 is a cross-sectional view depicting a semiconductor device and a substrate having another embodiment of the male and female members of the conductive structure in communication with a contact pad thereof.

Turning to FIG. 7, an alternative embodiment of a conductive structure 30' incorporating teachings of the present invention is illustrated. Conductive structure 30' has a male member 40', illustrated as being secured over a contact pad 12 of semiconductor device 10, and a female member 50', which, as illustrated, is secured to a contact pad 22 of substrate 20.

As illustrated, the periphery of the end portion 43' of jacket 42' is smaller than the periphery of the remainder of jacket 42', with an outer ledge 48 being formed at the junction between end portion 43' and the remainder, or base portion 45', of jacket 42'. When male member 40' is interconnected with female member 50', a complementarily configured upper portion 58' of aperture 54' receives end portion 43' of male member 40' and outer ledge 48 prevents further insertion of male member 40' into aperture 54' of female member 50'. Thus, outer ledge 48 defines a minimum length of conductive structure 30' and a minimum distance between an assembled semiconductor device 10 and substrate 20.

With continued reference to FIG. 7, in addition to male member 40' including an outer ledge 48, or alternatively thereto, upper portion 58' of aperture 54' can have a larger periphery than the remainder of aperture 54', with an internal ledge 55 being formed at the junction between upper portion 58' and the remainder of aperture 54'. Internal ledge 55 acts as a stop for male member 40' during insertion thereof into aperture 54' and prevents male member 40' from being inserted too far into aperture 54' of female member 50'. Internal ledge 55 may also be used as a line of demarcation to identify an optimum level for filling aperture 54' with conductive material so as to facilitate an electrical communication between a contact pad 12 of semiconductor device 10 and a corresponding contact pad 22 of substrate 20 while avoiding the use of an excessive quantity of conductive material as male member 40' and female member 50' are interconnected.

Figure 8:
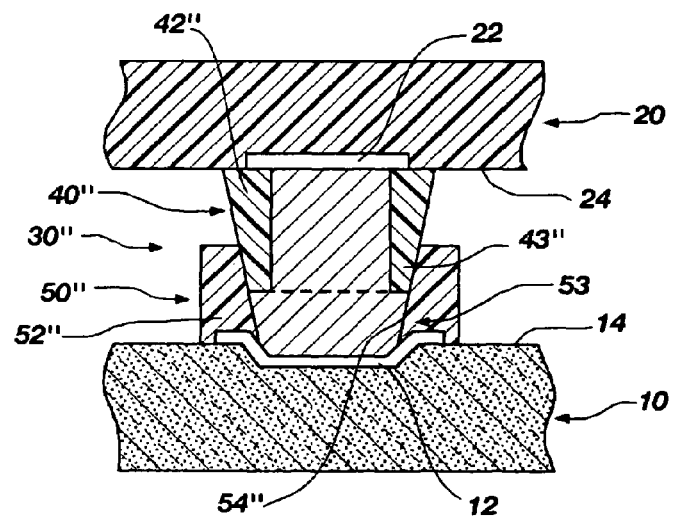
FIG. 8 is a cross-sectional view depicting another embodiment of the conductive structure, with the male and female members thereof secured to corresponding contact pads of a semiconductor device and a substrate.

FIG. 8 illustrates another embodiment of a conductive structure 30" according to the present invention, wherein the larger end of a frustoconically shaped or otherwise tapered male member 40" thereof is secured to a contact pad 22 of substrate 20 and the female member 50" thereof is secured to a contact pad 12 of semiconductor device 10. Female member 50" has an aperture 54" configured to receive at least an end portion 43" of the jacket 42" of male member 40". The tapering of the outer surface of jacket 42" facilitates self-alignment of male member 40" and female member 50" when semiconductor device 10 and substrate 20 are not precisely and accurately aligned. In addition, jacket 42" may be tapered and aperture 54" sized so as to permit male member 40" to insert only a predetermined, specific distance into aperture 54" of female member and, thus, define a minimum length of conductive structure 30", as well as a minimum assembled distance between semiconductor device 10 and substrate 20.

Figure 9:
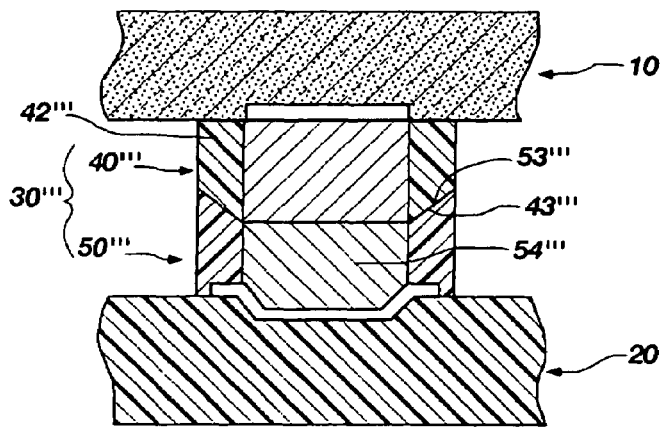
FIG. 9 is a cross-sectional view depicting yet another embodiment of the conductive structure, with the male and female members thereof secured to corresponding contact pads of a semiconductor device and a substrate.

Yet another embodiment of a conductive structure 30''' according to the present invention is illustrated in FIG. 9. The male and female members 40''', 50''', respectively, of conductive structure 30''' each have substantially cylindrical shapes. The outer surface of the jacket 42''' of end 43''' male member 40''', remote from semiconductor device 10 to which male member 40''' is secured, tapers inwardly toward the center of male member 40'''. Female member 50''' has an aperture 54''' with an inner surface and an end remote from substrate 20 to which female member 50''' is secured that tapers outwardly toward a periphery of female member 50'''. The tapered ends 43''', 53''' of male member 40''' and female member 50''', respectively, are complementarily configured, thereby facilitating the receipt of end 43''' by end 53'''. Accordingly, upon interconnection of male member 40''' and female member 50''', conductive structure 30''' has a substantially cylindrical shape.

Figure 10:
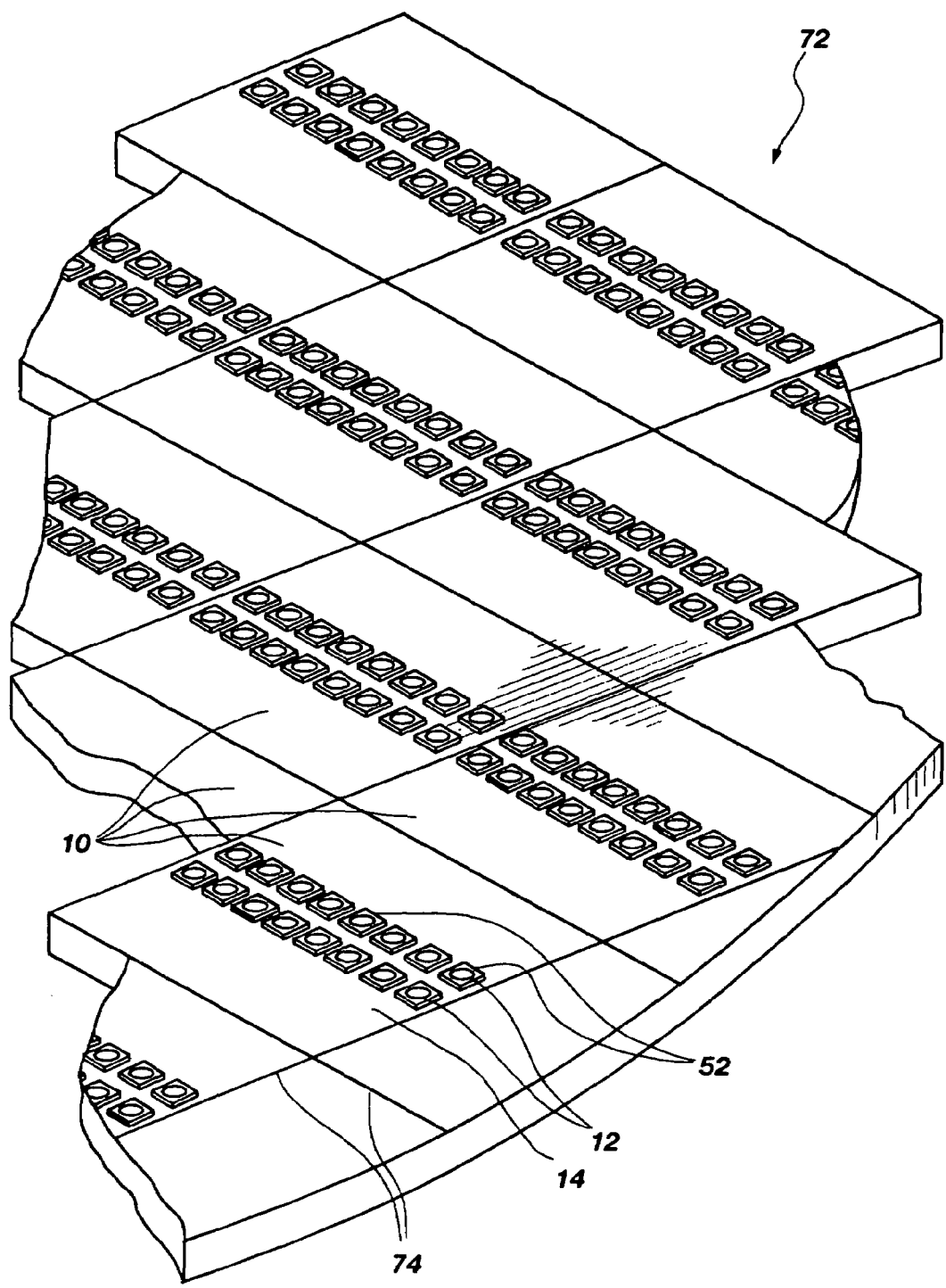
FIG. 10 is a perspective view of a portion of a wafer having a plurality of semiconductor devices thereon, depicting female members of the conductive structures being fabricated around each of the contact pads of the semiconductor devices at the wafer level.

Turning now to FIG. 10, a wafer 72 with a plurality of semiconductor devices 10 thereon is illustrated. Each semiconductor device 10, which has yet to be singulated, or diced, from wafer 72, has female members 50 of conductive structures 30 secured to the contact pads 12 (see FIG. 7) thereof. Each semiconductor device 10 on wafer 72 is separated from adjacent semiconductor devices 10 by a street 74.

While the jackets of the male and female members of the conductive structures according to the present invention, including jackets 42, 42', 42", 52, 52', 52", are preferably substantially simultaneously fabricated on or secured to a collection of semiconductor devices 10 or substrates 20, such as prior to singulating semiconductor dice from a wafer 72, the jackets of each of the members of the conductive structures can also be fabricated on or secured to collections of individual semiconductor devices 10 or substrates 20, or to individual semiconductor devices 10 or substrates 20. As another alternative, the jackets can be substantially simultaneously fabricated on or secured to a collection of different types of semiconductor devices 10 or substrates 20.

The jackets of both members of the conductive structures of the present invention can be fabricated directly on semiconductor devices 10 or substrates 20. Alternatively, the jackets can be fabricated separately from semiconductor devices 10 or substrates 20, then secured thereto as known in the art, such as by the use of a suitable adhesive.

The jackets are preferably fabricated from a photo-curable polymer, or "photopolyner," by stereolithographic processes. When fabricated directly on a semiconductor device 10 or substrate, the jackets can be made either before or after preformed conductive centers 46, 56 are connected to contact pads 12 of semiconductor device 10 or to contact pads 22 of substrate 20.

For simplicity, the ensuing description is limited to an explanation of a method of fabricating jackets 52 on a semiconductor device 10 prior to placing conductive material in contact with contact pads 12 of semiconductor device 10. As should be appreciated by those of skill in the art however, the method described herein is also useful for fabricating the jackets of other embodiments of the female member of a conductive structure according to the present invention on one or more semiconductor devices or substrates, as well as for fabricating the jackets of any embodiment of a male member of a conductive structure that incorporates teachings of the present invention on one or more semiconductor devices or substrates.

Stereolithography Apparatus and Methods

Figure 11:
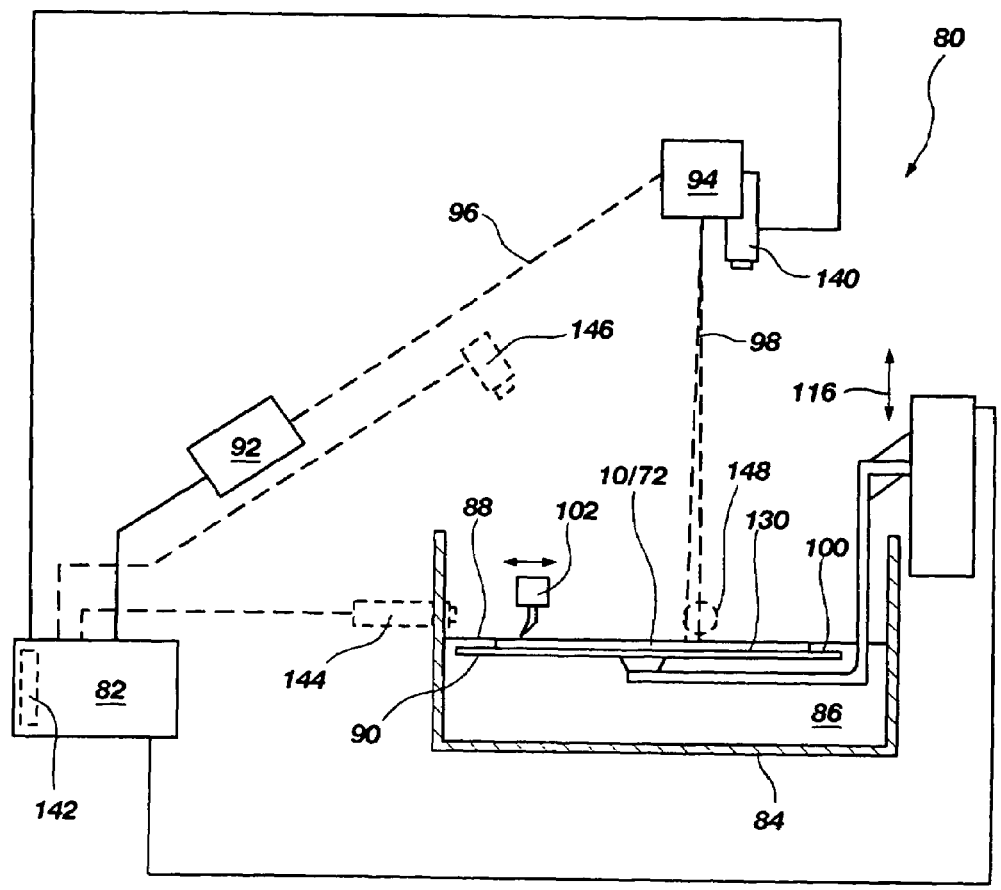
FIG. 11 is a schematic representation of an exemplary stereolithography apparatus that can be employed in the method of the present invention to fabricate a jacket of a male member of a conductive structure of the present invention.

FIG. 11 schematically depicts various components, and operation, of an exemplary stereolithography apparatus 80 to facilitate the reader's understanding of the technology employed in implementation of the method of the present invention, although those of ordinary skill in the art will understand and appreciate that apparatus of other designs and manufacture may be employed in practicing the method of the present invention. The preferred, basic stereolithography apparatus for implementation of the method of the present invention, as well as operation of such apparatus, are described in great detail in United States patents assigned to 3D Systems, Inc. of Valencia, Calif., such patents including, without limitation, U.S. Pat. Nos. 4,575,330; 4,929,402; 4,996,010; 4,999,143; 5,015,424; 5,058,988; 5,059,021; 5,059,359; 5,071,337; 5,076,974; 5,096,530; 5,104,592; 5,123,734; 5,130,064; 5,133,987; 5,141,680; 5,143,663; 5,164,128; 5,174,931; 5,174,943; 5,182,055; 5,182,056; 5,182,715; 5,184,307; 5,192,469; 5,192,559; 5,209,878; 5,234,636; 5,236,637; 5,238,639; 5,248,456; 5,256,340; 5,258,146; 5,267,013; 5,273,691; 5,321,622; 5,344,298; 5,345,391; 5,358,673; 5,447,822; 5,481,470; 5,495,328; 5,501,824; 5,554,336; 5,556,590; 5,569,349; 5,569,431; 5,571,471; 5,573,722; 5,609,812; 5,609,813; 5,610,824; 5,630,981; 5,637,169; 5,651,934; 5,667,820; 5,672,312; 5,676,904; 5,688,464; 5,693,144; 5,695,707; 5,711,911; 5,776,409; 5,779,967; 5,814,265; 5,850,239; 5,854,748; 5,855,718; 5,855,836; 5,885,511; 5,897,825; 5,902,537; 5,902,538; 5,904,889; 5,943,235; and 5,945,058. The disclosure of each of the foregoing patents is hereby incorporated herein by this reference.

With continued reference to FIG. 11 and as noted above, a 3-D CAD drawing of an object to be fabricated in the form of a data file is placed in the memory of a computer 82 controlling the operation of apparatus 80, if computer 82 is not a CAD computer in which the original object design is effected. In other words, an object design may be effected in a first computer in an engineering or research facility and the data files transferred via wide or local area network, tape, disc, CD-ROM, or otherwise as known in the art to computer 82 of apparatus 80 for object fabrication.

The data is preferably formatted in an STL (for STereo Lithography) file, STL being a standardized format employed by a majority of manufacturers of stereolithography equipment. Fortunately, the format has been adopted for use in many solid-modeling CAD programs, so translation from another internal geometric database format is often unnecessary. In an STL file, the boundary surfaces of an object are defined as a mesh of interconnected triangles.

Apparatus 80 also includes a reservoir 84 (which may comprise a removable reservoir interchangeable with others containing different materials) of an unconsolidated material 86 to be employed in fabricating the intended object. In the currently preferred embodiment, the unconsolidated material 86 is a liquid, photo-curable polymer, or "photopolymer," that cures in response to light in the UV wavelength range. The surface level 88 of material 86 is automatically maintained at an extremely precise, constant magnitude by devices known in the art responsive to output of sensors within apparatus 80 and preferably under control of computer 82. A support platform or elevator 90, precisely vertically movable in fine, repeatable increments responsive to control of computer 82, is located for movement downward into and upward out of material 86 in reservoir 84.

An object may be fabricated directly on platform 90, or on a substrate disposed on platform 90. When the object is to be fabricated on a substrate disposed on platform 90, the substrate may be positioned on platform 90 and secured thereto by way of one or more base supports 122. Such base supports 122 may be fabricated before or simultaneously with the stereolithographic fabrication of one or more objects on platform 90 or a substrate disposed thereon. These base supports 122 may support, or prevent lateral movement of, the substrate or object being formed relative to a surface 100 of platform 90. Base supports 122 may also provide a perfectly horizontal reference plane for fabrication of one or more objects thereon, as well as facilitate the removal of a substrate or formed object from platform 90 following the stereolithographic fabrication of one or more objects on the substrate. Moreover, where a so-called "recoater" blade 102 is employed to form a layer of material on platform 90 or a substrate disposed thereon, base supports 122 can preclude inadvertent contact of recoater blade 102, to be described in greater detail below, with surface 100 of platform 90.

Apparatus 80 has a UV wavelength range laser plus associated optics and galvanometers (collectively identified as laser 92) for controlling the scan of laser beam 96 in the X-Y plane across platform 90. Laser 92 has associated therewith a mirror 94 to reflect beam 96 downwardly as beam 98 toward surface 100 of platform 90. Beam 98 is traversed in a selected pattern in the X-Y plane, that is to say in a plane parallel to surface 100, by initiation of the galvanometers under control of computer 82 to at least partially cure, by impingement thereon, selected portions of material 86 disposed over surface 100 to at least a partially consolidated (e.g., semisolid)

state. The use of mirror 94 lengthens the path of the laser beam, effectively doubling same, and provides a more vertical beam 98 than would be possible if the laser 92 itself were mounted directly above platform surface 100, thus enhancing resolution.

Figure 5:
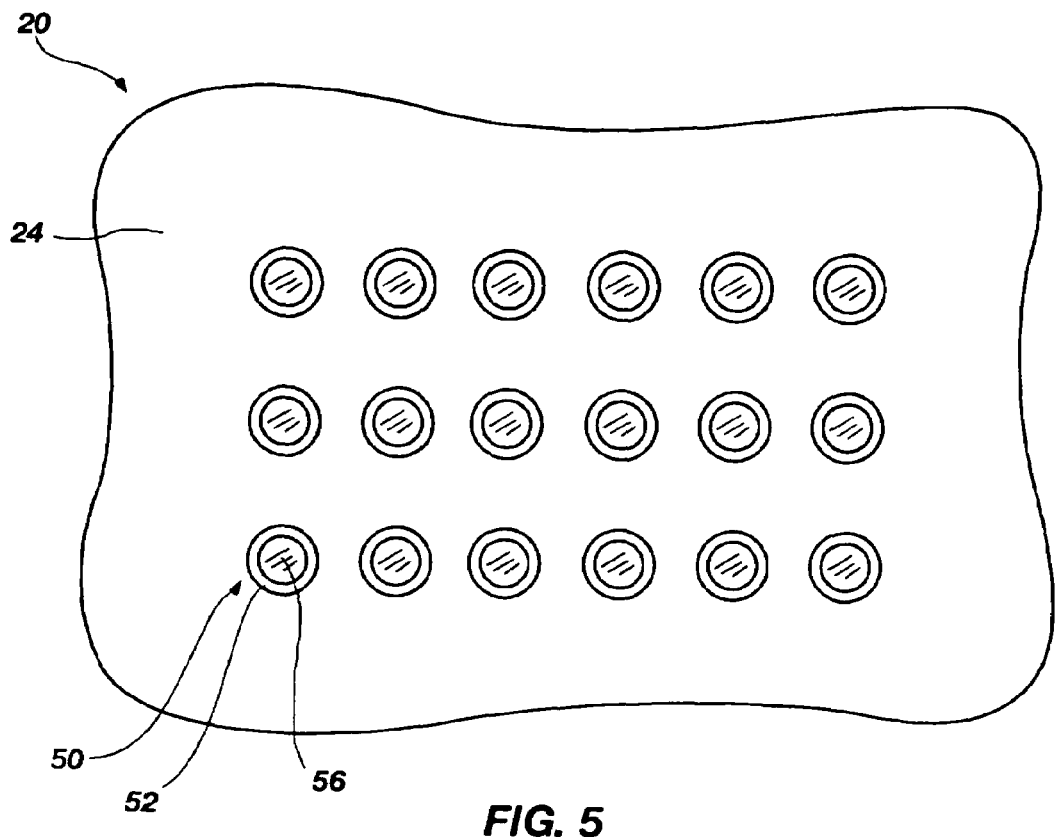
FIG. 5 is a bottom plan view of the carrier substrate of FIG. 1.
Figure 12:
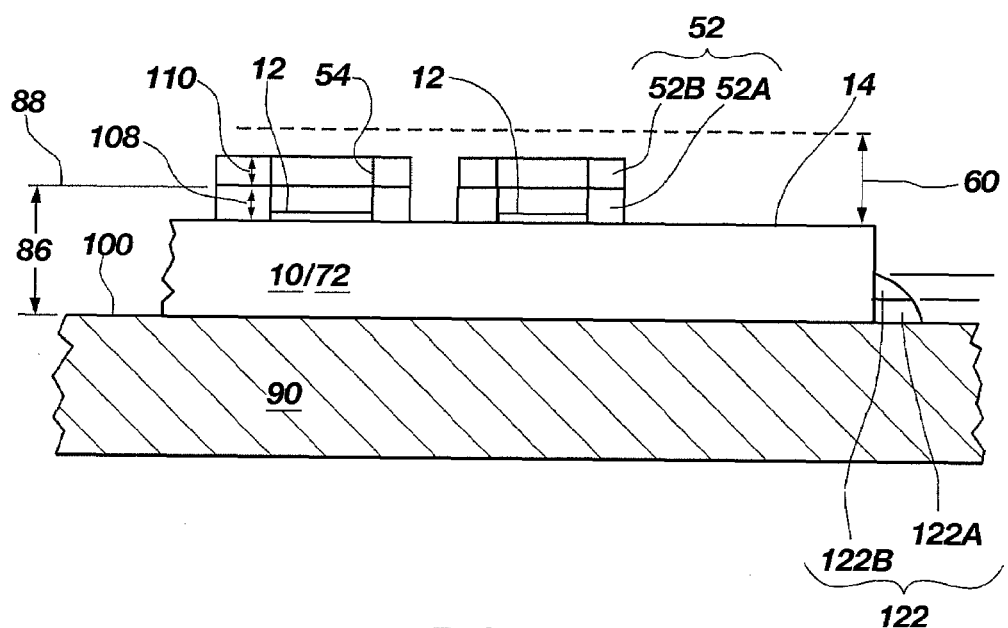
FIG. 12 is a partial cross-sectional side view of a semiconductor device disposed on a platform of a stereolithographic apparatus for the formation of jackets of a male member of a conductive structure around the contact pads of the semiconductor device.

Referring now to FIGS. 11 and 12, data from the STL files resident in computer 82 is manipulated to build an object, such as jacket 52, illustrated in FIGS. 1, 3, and 5, or base supports 122, one layer at a time. Accordingly, the data mathematically representing one or more of the objects to be fabricated are divided into subsets, each subset representing a slice or layer of the object. The division of data is effected by mathematically sectioning the 3-D CAD model into at least one layer, a single layer or a "stack" of such layers representing the object. Each slice may be from about 0.0001 to about 0.0300 inch thick. As mentioned previously, a thinner slice promotes higher resolution by enabling better reproduction of fine vertical surface features of the object or objects to be fabricated.

When one or more base supports 122 are to be stereolithographically fabricated, base supports 122 may be programmed as a separate STL file from the other objects to be fabricated. The primary STL file for the object or objects to be fabricated and the STL file for base support(s) 122 are merged.

Before fabrication of a first layer for a base support 122 or an object is commenced, the operational parameters for apparatus 80 are set to adjust the size (diameter if circular) of the laser light beam used to cure material 86. In addition, computer 82 automatically checks and, if necessary, adjusts by means known in the art the surface level 88 of material 86 in reservoir 84 to maintain same at an appropriate focal length for laser beam 98. U.S. Pat. No. 5,174,931, referenced above and previously incorporated herein by reference, discloses one suitable level control system. Alternatively, the height of mirror 94 may be adjusted responsive to a detected surface level 88 to cause the focal point of laser beam 98 to be located precisely at the surface of material 86 at surface level 88 if surface level 88 is permitted to vary, although this approach is more complex Platform 90 may then be submerged in material 86 in reservoir 84 to a depth equal to the thickness of one layer or slice of the object to be formed, and the liquid surface level 88 is readjusted as required to accommodate material 86 displaced by submergence of platform 90. Laser 92 is then activated so laser beam 98 will scan unconsolidated (e.g., liquid or powdered) material 86 disposed over surface 100 of platform 90 to at least partially consolidate (e.g., polymerize to at least a semisolid state) material 86 at selected locations, defining the boundaries of a first layer 122A of base support 122 and filing in solid portions thereof. Platform 90 is then lowered by a distance equal to thickness of second layer 122B, and laser beam 98 scanned over selected regions of the surface of material 86 to define and fill in the second layer 122B, while simultaneously bonding the second layer 122B to the first layer 122A. The process may be then repeated, as often as necessary, layer by layer, until base support 122 is completed. Platform 90 is then moved relative to mirror 94 to form any additional base supports 122 on platform 90 or a substrate disposed thereon or to fabricate objects upon platform 90, base support 122, or a substrate, as provided in the control software. The number of layers required to erect base support 122 or one or more other objects to be formed depends upon the height of the object or objects to be formed and the desired layer thickness 108, 110. The layers of a stereolithographically fabricated structure with a plurality of layers may have different thicknesses.

If a recoater blade 102 is employed, the process sequence is somewhat different. In this instance, surface 100 of platform 90 is lowered into unconsolidated (e.g., liquid) material 86 below surface level 88 a distance greater than a thickness of a single layer of material 86 to be cured, then raised above surface level 88 until platform 90, a substrate disposed thereon, or a structure being formed on either platform 90 or a substrate thereon is precisely one layer's thickness below blade 102. Blade 102 then sweeps horizontally over platform 90 or (to save time) at least over a portion thereof on which one or more objects are to be fabricated to remove excess material 86 and leave a film of precisely the desired thickness. Platform 90 is then lowered so that the surface of the film and, thus, surface level 88 are coplanar and the surface of the unconsolidated material 86 is still. Laser 92 is then initiated to scan with laser beam 98 and define the first layer 130. The process is repeated, layer by layer, to define each succeeding layer 130 and simultaneously bond same to the next lower layer 130 until all of the layers of the object or objects to be fabricated are completed. A more detailed discussion of this sequence and apparatus for performing same is disclosed in U.S. Pat. No. 5,174,931, previously incorporated herein by reference.

As an alternative to the above approach to preparing a layer of material 86 for scanning with laser beam 98, a layer of unconsolidated (e.g., liquid) material 86 may be formed on surface 100 of support platform 90, on a substrate disposed on platform 90, or on one or more objects being fabricated by lowering platform 90 to flood material 86 over surface 100, over the substrate disposed thereon, or over the highest completed layer of the object or objects being formed, then raising platform 90 and horizontally traversing a so-called "meniscus" blade horizontally over platform 90 to form a layer of unconsolidated material having the desired thickness over platform 90, the substrate, or each of the objects being formed. Laser 92 is then initiated and a laser beam 98 scanned over the layer of unconsolidated material 86 to define at least the boundaries of the solid regions the next higher layer of the object or objects being fabricated.

Yet another alternative to layer preparation of unconsolidated (e.g., liquid) material 86 is to merely lower platform 90 to a depth equal to that of a layer of material 86 to be scanned, and to then traverse a combination flood bar and meniscus bar assembly horizontally over platform 90, a substrate disposed on platform 90, or one or more objects being formed to substantially concurrently flood material 86 thereover and to define a precise layer thickness of material 86 for scanning.

All of the foregoing approaches to liquid material flooding and layer definition and apparatus for initiation thereof are known in the art and are not material to practice of the present invention, so no further details relating thereto will be provided herein.

In practicing the present invention, a commercially available stereolithography apparatus operating generally in the manner as that described above with respect to apparatus 80 of FIG. 11 is preferably employed, but with further additions and modifications as hereinafter described for practicing the method of the present invention. For example and not by way of limitation, the SLA-250/50HR, SLA-5000 and SLA-7000 stereolithography systems, each offered by 3D Systems, Inc, of Valencia, Calif., are suitable for modification. Photopolymers believed to be suitable for use in practicing the present invention include Cibatool SL 5170 and SL 5210 resins for the SLA-250/50HR system, Cibatool SL 5530 resin for the SLA-5000 and 7000 systems, and Cibatool SL 7510 resin for the SLA-7000 system. All of these photopolymers are available from Ciba Specialty Chemicals Inc.

By way of example and not limitation, the layer thickness of material 86 to be formed, for purposes of the invention, may be on the order of about 0.0001 to 0.0300 inch, with a high degree of uniformity. It should be noted that different material layers may have different heights, so as to form a structure of a precise, intended total height or to provide different material thicknesses for different portions of the structure. The size of the laser beam "spot" impinging on the surface of material 86 to consolidate (e.g., cure) same may be on the order of 0.001 inch to 0.008 inch. Resolution is preferably +0.0003 inch in the X-Y plane (parallel to surface 100) over at least a 0.5 inch×0.25 inch field from a center point, permitting a high resolution scan effectively across a 1.0 inch×0.5 inch area. Of course, it is desirable to have substantially this high a resolution across the entirety of surface 100 of platform 90 to be scanned by laser beam 98, such area being termed the "field of exposure," such area being substantially coextensive with the vision field of a machine vision system employed in the apparatus of the invention as explained in more detail below. The longer and more effectively vertical the path of laser beam 96/98, the greater the achievable resolution.

Referring again to FIG. 11, it should be noted that apparatus 80 useful in the method of the present invention includes a camera 140 which is in communication with computer 82 and preferably located, as shown, in close proximity to optics and scan controller 94 located above surface 100 of support platform 90. Camera 140 may be any one of a number of commercially available cameras, such as capacitive-coupled discharge (CCD) cameras available from a number of vendors. Suitable circuitry as required for adapting the output of camera 140 for use by computer 82 may be incorporated in a board 142 installed in computer 82, which is programmed as known in the art to respond to images generated by camera 140 and processed by board 142. Camera 140 and board 142 may together comprise a so-called "machine vision system" and, specifically, a "pattern recognition system" (PRS), operation of which will be described briefly below for a better understanding of the present invention. Alternatively, a self-contained machine vision system available from a commercial vendor of such equipment may be employed. For example, and without limitation, such systems are available from Cognex Corporation of Natick, Mass. For example, the apparatus of the Cognex BGA INSPECTION PACKAGE™ or the SMD PLACEMENT GUIDANCE PACKAGE™ may be adapted to the present invention, although it is believed that the MVS-8000™ product family and the CHECKPOINT® product line, the latter employed in combination with Cognex PATMAX™ software, may be especially suitable for use in the present invention.

It is noted that a variety of machine vision systems are in existence, examples of which and their various structures and uses are described, without limitation, in U.S. Pat. Nos. 4,526, 646; 4,543,659; 4,736,437; 4,899,921; 5,059,559; 5,113,565; 5,145,099; 5,238,174; 5,463,227; 5,288,698; 5,471,310; 5,506,684; 5,516,023; 5,516,026; and 5,644,245. The disclosure of each of the immediately foregoing patents is hereby incorporated by this reference.

Stereolithographic Fabrication of the Jackets

In order to facilitate fabrication of one or more dielectric jackets 52 in accordance with the method of the present invention with apparatus 80, a data file representative of the size, configuration, thickness and surface topography of, for example, a particular type and design of semiconductor device 10 or other substrate upon which one or more jackets 52 are to be mounted is placed in the memory of computer 82. Also, as jackets 52 are configured to be interconnected with complementary jackets 42 (see FIGS. 1 and 6) of male members 40 on another substrate, a data file representative of the substrate to which male members 40 are to be secured and the features thereof, as well as a data file representative of male members 40, may be placed in memory.

One or more semiconductor devices 10, wafers 72 (see FIG. 10), or other substrates may be placed on surface 100 of platform 90 for fabrication of one or more dielectric jackets 52 around contact pads 12 thereof. If one or more semiconductor devices 10, wafers 72, or other substrates are to be held on or supported above platform 90 by stereolithographically formed base supports 122, one or more layers of material 86 are sequentially disposed on surface 100 and selectively altered by use of laser 92 to form base supports 122.

Camera 140 is then activated to locate the position and orientation of each semiconductor device 10, including those on a wafer 72 (see FIG. 10), or other substrate upon which one or more dielectric jackets 52 are to be fabricated. The features of each semiconductor device 10, wafer 72, or other substrate are compared with those in the data file residing in memory, the locational and orientational data for each semiconductor device 10, wafer 72, or other substrate then also being stored in memory. It should be noted that the data file representing the design size, shape and topography for each semiconductor device 10 or other substrate may be used at this juncture to detect physically defective or damaged semiconductor devices 10 or other substrates prior to fabricating jackets 52 thereon or before conducting further processing or assembly of semiconductor device 10 or other substrates. Accordingly, such damaged or defective semiconductor devices 10 or other substrates can be deleted from the process of fabricating jackets 52, from further processing, or from assembly with other components. It should also be noted that data files for more than one type (size, thickness, configuration, surface topography) of each semiconductor device 10 or other substrate may be placed in computer memory and computer 82 programmed to recognize not only the locations and orientations of each semiconductor device 10 or other substrate, but also the type of semiconductor device 10 or other substrate at each location upon platform 90 so that material 86 may be at least partially consolidated by laser beam 98 in the correct pattern and to the height required to define jackets 52 in the appropriate, desired locations on each semiconductor device 10 or other substrate.

Continuing with reference to FIGS. 11 and 12, wafer 72 or the one or more semiconductor devices 10 or other substrates on platform 90 may then be submerged partially below the surface level 88 of liquid material 86 to a depth greater than the thickness of a first layer of material 86 to be at least partially consolidated (e.g., cured to at least a semisolid state) to form the lowest layer 130 of each dielectric jacket 52 at the appropriate location or locations on each semiconductor device 10 or other substrate, then raised to a depth equal to the layer thickness, surface level 88 of material 86 being allowed to become calm. Photopolymers that are useful as material 86 exhibit a desirable dielectric constant, low shrinkage upon cure, are of sufficient (i.e., semiconductor grade) purity, exhibit good adherence to other semiconductor device materials, and have a similar coefficient of thermal expansion (CTE) to the material of conductive centers 46, 56 (FIGS. 1-6) (e.g., solder or other metal or metal alloy, conductive resin, or conductive elastomer). Preferably, the CTE of material 86 is sufficiently similar to that of the material of conductive centers 46, 56 to prevent undue stressing thereof during thermal cycling of semiconductor device 10 or substrate 20 in testing, subsequent processing, and subsequent normal operation. Exemplary photopolymers exhibiting these properties are believed to include, but are not limited to, the above-referenced resins from Ciba Specialty Chemicals Inc. One area of particular concern in determining resin suitability is the substantial absence of mobile ions and, specifically, fluorides.

Laser 92 is then activated and scanned to direct beam 98, under control of computer 82, toward specific locations of surface level 88 relative to each semiconductor device 10 or other substrate to effect the aforementioned partial cure of material 86 to form a first layer 52A of each jacket 52. Platform 90 is then lowered into reservoir 84 and raised a distance equal to the desired thickness of another layer 52B of each jacket 52, and laser 92 is activated to add another layer 52B to each jacket 52 under construction. This sequence continues, layer by layer, until each of the layers of jackets 52 have been completed.

In FIG. 12, the first layer of a dielectric jacket 52 is identified by numeral 52A, and the second layer is identified by numeral 52B. Likewise, the first layer of base support 122 is identified by numeral 122A and the second layer thereof is identified by numeral 122B. As illustrated, both base support 122 and jacket 52 have only two layers. Jackets 52 with any number of layers are, however, within the scope of the present invention.

Each layer 52A, 52B of a dielectric jacket 52 is preferably built by first defining any internal and external object boundaries of that layer with laser beam 98, then hatching solid areas of jacket 52 located within the object boundaries with laser beam 98. An internal boundary of a layer may comprise aperture 54, a through-hole, a void, or a recess in jacket 52, for example. If a particular layer includes a boundary of a void in the object above or below that layer, then laser beam 98 is scanned in a series of closely spaced, parallel vectors so as to develop a continuous surface, or skin, with improved strength and resolution. The time it takes to form each layer depends upon the geometry thereof the surface tension and viscosity of material 86, and the thickness of that layer.

Alternatively, dielectric jackets 52 may each be formed as a partially cured outer skin extending above surface 14 of semiconductor device 10 or above surface 24 of test substrate 20 and forming a dam within which unconsolidated material 86 can be contained. This may be particularly useful where the jackets 52 protrude a relatively high distance 60 from surface 14. In this instance, support platform 90 may be submerged so that material 86 enters the area within the dam, raised above surface level 88, and then laser beam 98 activated and scanned to at least partially cure material 86 residing within the dam or, alternatively, to merely cure a "skin" comprising the surface of dielectric jackets 52, a final cure of the material 86 of the jackets 52 being effected subsequently by broad-source UV radiation in a chamber, or by thermal cure in an oven. In this manner, jackets 52 of extremely precise dimensions may be formed of material 86 by apparatus 80 in minimal time.

When dielectric jackets 52", depicted in FIG. 8, are being fabricated on a substrate, such as semiconductor device 10, having a conductive center 56" already secured to the contact pads 12 thereof some of material 86 may be located in shadowed areas 53 (see FIG. 8). As laser beam 98 is directed substantially vertically downwardly toward surface level 88 of material 86, material 86 located in shadowed regions 53 will not be contacted or altered by laser beam 98. Nonetheless, the unconsolidated material 86 in shadowed areas 53 will become trapped therein as material 86 adjacent to and laterally outward from shadowed areas 53 is at least partially consolidated and as jacket 52 is built up around conductive center 56". Such trapped, unconsolidated material 86 will eventually cure due to the cross-linking initiated in the outwardly adjacent photopolymer, and the cure can be subsequently accelerated as known in the art, such as by a thermal cure.

Once dielectric jackets 52, or at least the outer skins thereof, have been fabricated, platform 90 is elevated above surface level 88 of material 86 and platform 90 is removed from apparatus 80, along with any substrate (e.g., semiconductor device 10, wafer 72 (see FIG. 10), or other substrate) disposed thereon and any stereolithographically fabricated structures, such as jackets 52. Excess, unconsolidated material 86 (e.g., excess uncured liquid) may be manually removed from platform 90, from any substrate disposed thereon, and from jackets 52. Each semiconductor device 10, wafer 72, or other substrate is removed from platform 90, such as by cutting the substrate free of base supports 122. Alternatively, base supports 122 may be configured to readily release semiconductor devices 10, wafers 72, or other substrates. As another alternative, a solvent may be employed to release base supports 122 from platform 90. Such release and solvent materials are known in the art. See, for example, U.S. Pat. No. 5,447,822 referenced above and previously incorporated herein by reference.

Jackets 52 and semiconductor device 10 or test substrate 20 may also be cleaned by use of known solvents that will not substantially degrade, deform, or damage jackets 52 or a substrate to which jackets 52 are secured.

As noted previously, jackets 52 may then require postcuring. Jackets 52 may have regions of unconsolidated material contained within a boundary or skin thereof or in a shadowed area 53 (see FIGS. 5 and 6), or material 86 may be only partially consolidated (e.g., polymerized or cured) and exhibit only a portion (typically 40% to 60%) of its fully consolidated strength. Postcuring to completely harden jackets 52 may be effected in another apparatus projecting UV radiation in a continuous manner over jackets 52 or by thermal completion of the initial, UV-initiated partial cure.

It should be noted that the height, shape, or placement of each jacket 52 on each specific semiconductor device 10 or other substrate may vary, again responsive to output of camera 140 or one or more additional cameras 144 or 146, shown in broken lines, detecting the protrusion of unusually high (or low) preformed, preplaced conductive centers 56 which could affect the desired distance that jackets 52 will protrude from surface 14. Likewise, the lateral extent (i.e., diameter or width) of each preplaced conductive center may be recognized and the girth of the outer boundary of each jacket 52 adjusted accordingly. In any case, laser 92 is again activated to at least partially cure material 86 residing on each semiconductor device 10 or other substrate to form the layer or layers of each jacket 52.

Although FIGS. 11 and 12 illustrate the stereolithographic fabrication of jackets 52 on a substrate, such as a semiconductor device 10, a wafer 72 (FIG. 10), or another substrate, including a plurality of semiconductor devices 10 or other substrates, jackets 52 can be fabricated separately from a substrate, then secured to a substrate, by known processes, such as by the use of a suitable adhesive material.

The use of a stereolithographic process as exemplified above to fabricate dielectric jackets 52 is particularly advantageous since a large number of jackets 52 may be fabricated in a short time, the jacket height and position are computer controlled to be extremely precise, wastage of unconsolidated material 86 is minimal, solder coverage of passivation materials is avoided, and the stereolithography method requires minimal handling of semiconductor devices 10, wafers 72, or other substrates.

Stereolithography is also an advantageous method of fabricating dielectric jackets 52 according to the present invention since stereolithography can be conducted at substantially ambient temperature, the small spot size and rapid traverse of laser beam 98 resulting in negligible thermal stress upon semiconductor devices 10, wafers 72, or other substrates, as well as on the features thereof.

The stereolithography fabrication process may also advantageously be conducted at the wafer level or on multiple substrates, saving fabrication time and expense. As the stereolithography method of the present invention recognizes specific semiconductor devices 10 or other substrates 20, variations between individual substrates are accommodated. Accordingly, when the stereolithography method of the present invention is employed, jackets 52 can be simultaneously fabricated on different types of semiconductor devices 10 or other substrates 20, as well as on both semiconductor devices 10 and other substrates 20.

Of course, other known methods can also be used to fabricate the jackets of the conductive structures of the present invention. Exemplary methods include, but are not limited to, use of photoresist materials to form reinforcement structures and fabrication of the reinforcement structure from dielectric materials using known semiconductor device patterning (e.g., mask and etch) processes.

Fabricating Conductive Centers

Referring again to FIGS. 1-9, as disclosed previously herein, conductive centers 46, 56 of members 40, 50 can be preformed or formed after dielectric jackets 42, 52, respectively, have been secured to one of semiconductor device 10 and substrate 20. Preformed conductive centers 46, 56 can be made by known processes, such as by molding quantities of conductive material into a desired shape, then secured to a contact pad 12, 22 of a semiconductor device 10 or substrate 20, respectively, by known processes, such as by thermal bonding.

When conductive centers 46, 56 are formed after dielectric jackets 42, 52 have been secured to contact pads 12 of semiconductor device 10 or to contact pads 22 of substrate 20, conductive material is disposed in each aperture 44, 54 in jackets 42, 52. Preferably, unconsolidated, molten, or uncured liquid conductive material is placed into apertures 44, 54.

When a solder, metal, or metal alloy is used to form conductive centers 46, 56, molten material can be disposed into dielectric jackets 42, 52. As the melting temperatures of solders, metals, and metal alloys are typically very high, it is preferred that the material from which jackets 42, 52 are fabricated can withstand such temperatures without being damaged and without undergoing significant conformational or dimensional changes. For example, and not to limit the scope of the present invention, solder can be disposed in apertures 44, 54 by submerging jackets 42, 52 in a solder bath, after which the solder may be allowed to harden and the conductive members secured to contact pads. Alternatively, when solder is used to form conductive centers 46, 56, solder paste or a preformed solder brick can be disposed in apertures 44, 54, the subsequently reflowed to form conductive centers 46, 56.

Conductive thermoplastic materials can similarly be disposed in apertures 44, 54 in a melted state, then cooled to form conductive centers 46, 56. As an alternative, particles of thermoplastic conductive material can be placed in apertures 44, 54 and heated and cooled to form conductive centers 46, 56. Such heating and cooling may be effected either before or after male member 40 and female member 50 are interconnected.

Thermally curable conductive resins can also be disposed in apertures 44, 54 in an uncured or partially uncured state, then heated to cure the conductive resin and to form conductive centers 46, 56. As indicated previously herein, when thermally curable conductive resins are used, the conductive center 46, 56 of at least one of a pair of male and female members 40, 50 is left uncured or at least partially uncured until after male member 40 and female member 50 have been interconnected so as to allow for the full curing of the conductive resin and the formation of an integral conductive center extending through conductive structure 30.

Assembling a Semiconductor Device with a Substrate

Referring again to FIGS. 1 and 6, semiconductor device 10 is connected to substrate 20 by aligning male members 40 protruding from semiconductor device 10 with corresponding female members 50 on substrate 20. The ends of male members 40 are then inserted into upper portion 58 of apertures 54 of their corresponding female members 50 such that the conductive centers 46 and 56 of male member 40 and female member 50, respectively, can communicate with one another. As noted previously herein, male member 40 may alternatively be secured to substrate 20 and female member 50 may alternatively be secured to semiconductor device 10.

A single, integral conductive center can then be formed by bonding conductive centers 46 and 56. When conductive centers 46 and 56 are formed from a thermally curable conductive resin, at least one of conductive centers 46, 56 is left at least partially uncured until male member 40 and female member 50 are interconnected. The conductive material of conductive center 46, 56 can then be heated to a sufficient curing temperature so as to bond conductive center 46 to conductive center 56. When conductive centers 46 and 56 comprise a thermoplastic conductive elastomer, a solder, a metal, or a metal alloy, conductive centers 46 and 56 are heated to a sufficient temperature to wet or reflow the conductive material thereof and, thereby to bond each conductive center 46, 56 to its corresponding contact pad 12, 22 and to bond conductive center 46 to conductive center 56.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A conductive structure for connecting a contact pad of a semiconductor device and a contact pad of a substrate, comprising:

a female member comprising dielectric material and configured to be secured to the contact pad of one of the semiconductor device and the substrate, the female member defining an aperture configured to be located over the contact pad;

a conductive center partially filling the aperture, with an upper portion of the aperture being open;

a male member configured to be secured to the corresponding contact pad of another of the substrate and the semiconductor device, the male member including an end configured complementarily to an upper portion of the aperture of the female member, the male member including an aperture configured to be located over the corresponding contact pad; and
a conductive center substantially filling the aperture of the male member.

2. The conductive structure of claim 1, wherein the aperture of the female member is configured to partially limit insertion of the male member thereinto.

3. The conductive structure of claim 2, wherein the aperture comprises an inner ledge configured to prevent further insertion of the male member thereinto.

4. The conductive structure of claim 2, wherein the aperture tapers inwardly.

5. The conductive structure of claim 1, wherein an outer surface of the male member is configured to partially limit insertion of the male member into the aperture of the female member.

6. The conductive structure of claim 5, wherein the outer surface is tapered.

7. The conductive structure of claim 6, wherein the outer surface has a frustoconical configuration.

8. The conductive structure of claim 5, wherein the male member has an end portion with a smaller periphery than a base portion of the male member.

9. The conductive structure of claim 8, wherein the outer surface comprises an outer ledge between the end portion and the base portion of the male member.

10. The conductive structure of claim 1, wherein at least one of the male member and the female member comprises a photopolymer.

11. The conductive structure of claim 10, wherein the at least one of the male member and the female member comprises a plurality of superimposed, contiguous, mutually adhered layers of the photopolymer.

12. The conductive structure of claim 1, wherein the aperture of the female member is configured to facilitate alignment of the male member and the female member.

13. The conductive structure of claim 12, wherein the aperture tapers inwardly.

14. The conductive structure of claim 1, wherein an outer surface of the male member is configured to facilitate alignment of the male member and the female member.

15. The conductive structure of claim 14, wherein the outer surface tapers outward from the end to a base portion thereof.

16. The conductive structure of claim 15, wherein the outer surface has a frustoconical configuration.

17. The conductive structure of claim 1, wherein at least one of the conductive centers comprises at least partially unconsolidated conductive material.

18. The conductive structure of claim 17, wherein the at least partially unconsolidated conductive material is at least partially uncured conductive resin.

19. The conductive structure of claim 18, wherein the at least partially uncured conductive resin is uncured conductive resin.

20. The conductive structure of claim 1, wherein at least one of the conductive centers comprises a thermoplastic conductive elastomer.

21. The conductive structure of claim 1, wherein at least one of the conductive centers comprises a solder, a metal, or a metal alloy.

22. A semiconductor device component, comprising:
a substrate having at least one contact pad exposed at a surface thereof;
a first member of an alignment structure:
secured directly to and protruding from the at least one contact pad;
including an aperture through a length thereof; and
configured complementarily to and to be received by an aperture formed in a second member of the alignment structure, with the second member secured to a corresponding contact pad of another substrate of another semiconductor device component; and
a conductive center in the aperture of the first member, with the conductive center being laterally confined within at least a base portion of the aperture and substantially filling the aperture.

23. The semiconductor device component of claim 22, wherein said substrate comprises a flip-chip type semiconductor device.

24. The semiconductor device component of claim 23, wherein the flip-chip type semiconductor device comprises a flip chip die.

25. The semiconductor device component of claim 23, wherein the flip-chip type semiconductor device comprises a ball grid array package.

26. The semiconductor device component of claim 21, wherein the substrate comprises a chip-scale package.

27. The semiconductor device component of claim 22, wherein the substrate comprises a carrier substrate.

28. The semiconductor device component of claim 22, wherein the first member is configured to contain the conductive center over the at least one contact pad.

29. A semiconductor device component comprising:
a substrate having at least one contact pad exposed at a surface thereof;
a first member of an alignment structure:
secured directly to and protruding from the at least one contact pad;
including an aperture through a length thereof;
configured complementarily to a second member of a conductive structure, with the second member secured to a corresponding contact pad of another substrate of another semiconductor device component; and
including an outer surface having a smaller periphery at an end thereof than at a base portion thereof, the outer surface including an outer ledge located between the end and the base portion; and
a conductive center in the aperture of the first member, with the conductive center being laterally confined within at least a base portion of the aperture and substantially filling the aperture.

30. The semiconductor device component of claim 29, wherein the outer surface tapers outwardly from the end to the base portion.

31. The semiconductor device component of claim 30, wherein the outer surface has a frustoconical configuration.

32. A semiconductor device component, comprising:
a substrate having at least one contact pad exposed at a surface thereof;
a first member of an alignment structure:
secured directly to and protruding from the at least one contact pad;
including an aperture through a length thereof, an upper portion of the aperture having a larger periphery than a base portion of the aperture, with an internal ledge being disposed around at least a portion of a wall of the aperture between the upper portion and the base portion; and being configured complementarily to a second member of the alignment structure, with the second member secured to a corresponding contact pad of another substrate of another semiconductor device component; and a conductive center partially filling the aperture of the first member, with the conductive center being laterally confined within at least a base portion of the aperture.

33. The semiconductor device component of claim 32, wherein the aperture is configured to receive at least an end of the second member.

34. The semiconductor device component of claim 32, wherein the aperture tapers inwardly from the upper portion to the base portion.

35. A semiconductor device component, comprising:
a substrate having at least one contact pad exposed at a surface thereof;
a first member of an alignment structure:
secured directly to and protruding from the at least one contact pad;
including an aperture through a length thereof; and
configured complementarily to a second member of the alignment structure, with the second member secured to a corresponding contact pad of another substrate of another semiconductor device component; and
a conductive center comprising an at least partially unconsolidated conductive material in the aperture of the first member, with the conductive center being laterally confined within at least a base portion of the aperture.

36. The semiconductor device component of claim 35, wherein the at least partially unconsolidated conductive material is an at least partially uncured conductive resin.

37. The semiconductor device component of claim 36, wherein the at least partially uncured conductive resin is an uncured conductive resin.

38. A semiconductor device component, comprising:
a substrate having at least one contact pad exposed at a surface thereof;
a first member of an alignment structure:
secured directly to and protruding from the at least one contact pad;
including an aperture through a length thereof; and
configured complementarily to a second member of the alignment structure, with the second member secured to a corresponding contact pad of another substrate of another semiconductor device component; and
a conductive center comprising a thermoplastic conductive elastomer in the aperture of the first member, with the conductive center being laterally confined within at least a base portion of the aperture.

39. A semiconductor device component, comprising:
a substrate having at least one contact pad exposed at a surface thereof;
a first member of an alignment structure:
comprises a photopolymer;
is secured directly to and protrudes from the at least one contact pad;
includes an aperture through a length thereof; and
is configured complementarily to a second member of a conductive structure, with the second member secured to a corresponding contact pad of another substrate of another semiconductor device component; and
a conductive center partially filling the aperture of the first member, with the conductive center being laterally confined within at least a base portion of the aperture.

40. The semiconductor device component of claim 39, wherein the first member comprises a plurality of superimposed, contiguous, mutually adhered layers of the photopolymer.

41. A semiconductor device assembly, comprising:
at least one semiconductor device having a surface with at least one contact pad exposed thereto;
a substrate having a surface with at least one at least one contact pad exposed thereto, the at least one contact pad located correspondingly to the at least one contact pad of the at least one semiconductor device; and
a conductive structure secured to the at least one contact pad of the at least one semiconductor device and to the at least one contact pad of the substrate, the conductive structure having:
a first member comprising dielectric material secured directly to and protruding from one of the at least one semiconductor device and the substrate, the first member including an aperture therethrough;
a conductive center disposed in the aperture of the first member in communication with the at least one contact pad; and
a second member secured directly to and protruding from another of the at least one semiconductor device and the substrate, the second member located correspondingly to the first member, the second member including an aperture therethrough; and
a conductive center disposed in the aperture of the second member in communication with the at least one contact pad, the second member configured to be interconnected with the first member.

42. The semiconductor device assembly of claim 41, wherein one member of the first member and the second member has a receptacle configured to receive at least an end of the other member of the second member and the first member.

43. The semiconductor device assembly of claim 42, wherein the aperture of the one member has an upper portion with a smaller periphery than a base portion thereof.

44. The semiconductor device assembly of claim 43, wherein the aperture includes an inner ledge disposed between the upper portion and the base portion.

45. The semiconductor device assembly of claim 43, wherein at least a portion of a wall of the aperture tapers inwardly toward the base portion.

46. The semiconductor device assembly of claim 43, wherein the aperture is configured to limit a distance the other member is inserted into the receptacle.

47. The semiconductor device assembly of claim 42, wherein another member of the first member and the second member has an outer surface with a smaller periphery at the end than at a base portion thereof.

48. The semiconductor device assembly of claim 47, wherein the outer surface includes an outer ledge disposed between the end and the base portion.

49. The semiconductor device assembly of claim 47, wherein the outer surface tapers outwardly from the end to the base portion.

50. The semiconductor device assembly of claim 49, wherein the outer surface has a frustoconical configuration.

51. The semiconductor device assembly of claim 41, wherein the conductive center of at least one of the first and second members comprises an at least partially unconsolidated conductive material.

52. The semiconductor device assembly of claim 51, wherein the at least partially unconsolidated conductive material is an at least partially uncured conductive resin.

53. The semiconductor device assembly of claim 52, wherein the at least partially uncured conductive resin is an uncured conductive resin.

54. The semiconductor device assembly of claim 41, wherein the conductive center of at least one of the first and second members comprises a thermoplastic conductive elastomer.

55. The semiconductor device assembly of claim 41, wherein the conductive center of at least one of the first and second members comprises a solder, a metal, or a metal alloy.

56. The semiconductor device assembly of claim 41, wherein at least one member of the first and second members comprises a photopolymer.

57. The semiconductor device assembly of claim 56, wherein said at least one member comprises a plurality of superimposed, contiguous, mutually adhered layers of the photopolymer.

58. The semiconductor device assembly of claim 41, wherein the at least one semiconductor device comprises a flip-chip type semiconductor device.

59. The semiconductor device assembly of claim 58, wherein the flip-chip type semiconductor device is a semiconductor die with bond pads arranged in an array on a surface thereof.

60. The semiconductor device assembly of claim 58, wherein the flip-chip type semiconductor device is a ball grid array package.

61. The semiconductor device assembly of claim 41, wherein the at least one semiconductor device comprises a chip-scale package.

62. The semiconductor device assembly of claim 41, wherein the substrate comprises a carrier substrate.

63. The semiconductor device assembly of claim 41, wherein the substrate comprises another semiconductor device.

64. A conductive structure for connecting a contact pad of a semiconductor device and a contact pad of a substrate, comprising:
  a female member configured to be secured to the contact pad of one of the semiconductor device and the substrate, the female member including an aperture configured to be located over the contact pad;
  a conductive center partially filling the aperture with an upper portion of the aperture being open;
  a male member configured to be secured to a corresponding contact pad of another of the substrate and the semiconductor device, the male member including an end configured complementarily to the upper portion of the aperture of the female member, the male member including an aperture configured to be located over the corresponding contact pad; and
  a conductive center substantially filling the aperture of the male member,
  at least one of the conductive center of the female member and the conductive center of the male member comprising at least partially unconsolidated conductive material.

65. The conductive structure of claim 64, wherein the aperture of the female member is configured to partially limit insertion of the male member thereinto.

66. The conductive structure of claim 65, wherein the aperture comprises an inner ledge configured to prevent further insertion of the male member thereinto.

67. The conductive structure of claim 65, wherein the aperture tapers inwardly.

68. The conductive structure of claim 64, wherein an outer surface of the male member is configured to partially limit insertion of the male member into the aperture of the female member.

69. The conductive structure of claim 68, wherein the outer surface is tapered.

70. The conductive structure of claim 69, wherein the outer surface has a frustoconical configuration.

71. The conductive structure of claim 68, wherein the male member has an end portion with a smaller periphery than a base portion of the male member.

72. The conductive structure of claim 71, wherein the outer surface comprises an outer ledge between the end portion and the base portion of the male member.

73. The conductive structure of claim 64, wherein at least one of the male member and the female member comprises a photopolymer.

74. The conductive structure of claim 73, wherein the at least one of the male member and the female member comprises a plurality of superimposed, contiguous, mutually adhered layers of the photopolymer.

75. The conductive structure of claim 64, wherein the aperture of the female member is configured to facilitate alignment of the male member and the female member.

76. The conductive structure of claim 75, wherein the aperture tapers inwardly.

77. The conductive structure of claim 64, wherein an outer surface of the male member is configured to facilitate alignment of the male member and the female member.

78. The conductive structure of claim 77, wherein the outer surface tapers outward from the end to a base portion thereof.

79. The conductive structure of claim 78, wherein the outer surface has a frustoconical configuration.

80. The conductive structure of claim 64, wherein the at least partially unconsolidated conductive material is at least partially uncured conductive resin.

81. The conductive structure of claim 80, wherein the at least partially uncured conductive resin is uncured conductive resin.

82. The conductive structure of claim 64, wherein at least one of the conductive centers comprises a thermoplastic conductive elastomer.

83. The conductive structure of claim 64, wherein at least one of the conductive centers comprises a solder, a metal, or a metal alloy.

84. A semiconductor device component, comprising:
  a substrate having at least one contact pad exposed at a surface thereof;
  a first member of an alignment structure secured to the at least one contact pad, the first member including an aperture through a length thereof, the first member being configured complementarily to a second member of the alignment structure secured to a corresponding contact pad of another substrate of another semiconductor device component; and
  a conductive center comprising at least partially unconsolidated conductive material in the aperture of the first member.

85. The semiconductor device component of claim 84, wherein the substrate comprises a flip-chip type semiconductor device.

86. The semiconductor device component of claim 85, wherein the flip-chip type semiconductor device comprises a flip chip die.

87. The semiconductor device component of claim 85, wherein the flip-chip type semiconductor device comprises a ball grid array package.

88. The semiconductor device component of claim 84, wherein the substrate comprises a chip-scale package.

89. The semiconductor device component of claim 84, wherein the substrate comprises a carrier substrate.

90. The semiconductor device component of claim 84, wherein the first member is configured to contain the conductive center over the at least one contact pad.

91. The semiconductor device component of claim 84, wherein the conductive center substantially fills the aperture.

92. The semiconductor device component of claim 91, wherein the first member is configured to be received by an aperture formed in the second member.

93. The semiconductor device component of claim 91, wherein an outer surface of the first member has a smaller periphery at an end thereof than at a base portion thereof.

94. The semiconductor device component of claim 93, wherein the outer surface includes an outer ledge located between the end and the base portion.

95. The semiconductor device component of claim 93, wherein the outer surface tapers outwardly from the end to the base portion.

96. The semiconductor device component of claim 95, wherein the outer surface has a frustoconical configuration.

97. The semiconductor device component of claim 84, wherein the conductive center partially fills the aperture.

98. The semiconductor device component of claim 97, wherein the aperture is configured to receive at least an end of the second member.

99. The semiconductor device component of claim 97, wherein an upper portion of the aperture has a larger periphery than a base portion of the aperture.

100. The semiconductor device component of claim 99, wherein an internal ledge is disposed around at least a portion of a wall of the aperture between the upper portion and the base portion.

101. The semiconductor device component of claim 99, wherein the aperture tapers inwardly from the upper portion to the base portion.

102. The semiconductor device component of claim 84, wherein the at least partially unconsolidated conductive material is an at least partially uncured conductive resin.

103. The semiconductor device component of claim 102, wherein the at least partially uncured conductive resin is an uncured conductive resin.

104. The semiconductor device component of claim 84, wherein the conductive center comprises a thermoplastic conductive elastomer.

105. The semiconductor device component of claim 84, wherein the conductive center comprises a solder, a metal, or a metal alloy.

106. The semiconductor device component of claim 84, wherein the first member comprises a photopolymer.

107. The semiconductor device component of claim 106, wherein the first member comprises a plurality of superimposed, contiguous, mutually adhered layers of the photopolymer.

108. A semiconductor device assembly, comprising:
at least one semiconductor device having a surface with at least one contact pad exposed thereto;
a substrate having a surface with at least one at least one contact pad exposed thereto, the at least one contact pad located correspondingly to the at least one contact pad of the at least one semiconductor device; and
a conductive structure secured to the at least one contact pad of the at least one semiconductor device and to the at least one contact pad of the substrate, the conductive structure having:
a first member secured to one of the at least one semiconductor device and the substrate, the first member including an aperture therethrough;
a conductive center disposed in the aperture of the first member, the conductive center in communication with the at least one contact pad;
a second member secured to another of the at least one semiconductor device and the substrate, the second member located correspondingly to the first member, the second member including an aperture therethrough; and
a conductive center disposed in the aperture of the second member, the conductive center in communication with the at least one contact pad, the second member configured to be interconnected with the first member,
at least one of the conductive center of the first member and the conductive center of the second member comprising an at least partially unconsolidated conductive material.

109. The semiconductor device assembly of claim 108, wherein one member of the first member and the second member has a receptacle configured to receive at least an end of the other member of the second member and the first member.

110. The semiconductor device assembly of claim 109, wherein the aperture of the one member has an upper portion with a smaller periphery than a base portion thereof.

111. The semiconductor device assembly of claim 110, wherein the aperture includes an inner ledge disposed between the upper portion and the base portion.

112. The semiconductor device assembly of claim 110, wherein at least a portion of a wall of the aperture tapers inwardly toward the base portion.

113. The semiconductor device assembly of claim 110, wherein the aperture is configured to limit a distance the other member is inserted into the receptacle.

114. The semiconductor device assembly of claim 109, wherein another member of the first member and the second member has an outer surface with a smaller periphery at the end than at a base portion thereof.

115. The semiconductor device assembly of claim 114, wherein the outer surface includes an outer ledge disposed between the end and the base portion.

116. The semiconductor device assembly of claim 114, wherein the outer surface tapers outwardly from the end to the base portion.

117. The semiconductor device assembly of claim 116, wherein the outer surface has a frustoconical configuration.

118. The semiconductor device assembly of claim 108, wherein the at least partially unconsolidated conductive material is an at least partially uncured conductive resin.

119. The semiconductor device assembly of claim 118 wherein the at least partially uncured conductive resin is an uncured conductive resin.

120. The semiconductor device assembly of claim 108, wherein the conductive center of at least one of the first and second members comprises a thermoplastic conductive elastomer.

121. The semiconductor device assembly of claim 108, wherein the conductive center of at least one of the first and second members comprises a solder, a metal, or a metal alloy.

122. The semiconductor device assembly of claim 108, wherein at least one member of the first and second members comprises a photopolymer.

123. The semiconductor device assembly of claim 122, wherein the at least one member comprises a plurality of superimposed, contiguous, mutually adhered layers of the photopolymer.

124. The semiconductor device assembly of claim 108, wherein the at least one semiconductor device comprises a flip-chip type semiconductor device.

125. The semiconductor device assembly of claim 124, wherein the flip-chip type semiconductor device is a semiconductor die with bond pads arranged in an array on a surface thereof.

126. The semiconductor device assembly of claim 124, wherein the flip-chip type semiconductor device is a ball grid array package.

127. The semiconductor device assembly of claim 108, wherein the at least one semiconductor device comprises a chip-scale package.

128. The semiconductor device assembly of claim 108, wherein the substrate comprises a carrier substrate.

129. The semiconductor device assembly of claim 108, wherein the substrate comprises another semiconductor device.

* * * * *

UNITED STATES PATENT AND TRADEMARK OFFICE
CERTIFICATE OF CORRECTION

| | | |
|---|---|---|
| PATENT NO. | : 7,557,452 B1 | Page 1 of 1 |
| APPLICATION NO. | : 09/590646 | |
| DATED | : July 7, 2009 | |
| INVENTOR(S) | : Vernon M. Williams et al. | |

It is certified that error appears in the above-identified patent and that said Letters Patent is hereby corrected as shown below:

In column 20, line 15, in Claim 23, delete "said" and insert -- the --, therefor.

In column 20, line 19, in Claim 24, delete "flip chip" and insert -- flip-chip --, therefor.

In column 20, line 23, in Claim 26, delete "claim 21," and insert -- claim 22, --, therefor.

In column 20, line 30, in Claim 29, after "component" insert -- , --.

In column 22, line 8, in Claim 41, after "at least one" delete "at least one".

In column 23, line 15, in Claim 57, delete "said" and insert -- the --, therefor.

In column 24, line 64, in Claim 86, delete "flip chip" and insert -- flip-chip --, therefor.

In column 25, line 62, in Claim 108, after "at least one" delete "at least one".

In column 26, line 58, in Claim 119, delete "claim 118" and insert -- claim 118, --, therefor.

Signed and Sealed this

Twenty-fifth Day of August, 2009

David J. Kappos
*Director of the United States Patent and Trademark Office*